US012609180B2

(12) United States Patent
Yeh

(10) Patent No.: US 12,609,180 B2
(45) Date of Patent: Apr. 21, 2026

(54) DATA CHECK METHOD, MEMORY STORAGE DEVICE AND MEMORY CONTROL CIRCUIT UNIT

(71) Applicant: PHISON ELECTRONICS CORP., Miaoli (TW)

(72) Inventor: Chih-Kang Yeh, Kinmen County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 22 days.

(21) Appl. No.: 18/768,011

(22) Filed: Jul. 10, 2024

(65) Prior Publication Data

US 2025/0384946 A1 Dec. 18, 2025

(30) Foreign Application Priority Data

Jun. 18, 2024 (TW) .................................. 113122411

(51) Int. Cl.
*G11C 29/46* (2006.01)

(52) U.S. Cl.
CPC .................................... *G11C 29/46* (2013.01)

(58) Field of Classification Search
CPC ....................................................... G11C 29/46
See application file for complete search history.

(56) References Cited

U.S. PATENT DOCUMENTS

2023/0027240 A1* 1/2023 Luukkainen ........ G06F 12/0223

FOREIGN PATENT DOCUMENTS

TW 201618114 5/2016
TW 202223665 6/2022

OTHER PUBLICATIONS

"Office Action of Taiwan Counterpart Application", issued on Nov. 29, 2024, p. 1-p. 6.

* cited by examiner

*Primary Examiner* — Thien Nguyen
(74) *Attorney, Agent, or Firm* — JCIPRNET

(57) ABSTRACT

A data check method, a memory storage device, and a memory control circuit unit are disclosed. The method includes the following. A connection between a memory storage device and a host system is established. First check data is generated according to first data. The first check data is maintained in the memory storage device. A cross-device write command is sent through the connection to store the first data into a memory in the host system. After the cross-device write command is sent, a cross-device read command is sent through the connection to read back the first data from the memory in the host system. In response to cross-device reading meeting a check trigger condition, a first check operation is performed on the read-back first data according to the check data to check whether the read back first data is abnormal. In response to the cross-device reading not meeting the check trigger condition, the first check operation is skipped.

24 Claims, 6 Drawing Sheets

DATA CHECK METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 113122411, filed on Jun. 18, 2024. The entirety of the above-mentioned patent application is hereby incorporated by reference herein and made a part of this specification.

BACKGROUND

Technical Field

The disclosure relates to a data check method, a memory storage device, and a memory control circuit unit.

Description of Related Art

Portable electronic devices such as mobile phones and notebook computers have grown rapidly in recent years, resulting in a rapid increase in consumer demand for storage media. Since a rewritable non-volatile memory module (e.g., a flash memory) has characteristics of non-volatile data, power saving, small size, and no mechanical structure, it is very suitable to be built into the various portable electronic devices as exemplified above.

Some types of memory storage devices support the host memory buffering (HMB) technology. In an architecture using HMB, the memory storage device may use a memory of a host system as a buffer of the memory storage device, and may actively access data from the memory of the host system. For example, when the host system reads the data from the memory storage device or writes the data to the memory storage device, management data (e.g., management tables) required to access the memory storage device may be temporarily stored into the memory of the host system for the memory storage device to query or update at any time. However, in some cases, the data from the memory storage device may accidentally not be cached into the memory of the host system, causing a serious operating error occurring in the memory storage device when the memory storage device reads this data from the memory of the host system subsequently and performs related internal data management accordingly.

SUMMARY

The disclosure provides a data check method, a memory storage device, and a memory control circuit unit, which may effectively reduce a risk of serious operating errors in the memory storage device due to incorrect data being read from a memory in a host system under the premise of not affecting the data access performance between the memory storage device and the host system as much as possible.

An exemplary embodiment of the disclosure provides a data check method for a memory storage device. The data check method includes the following. A connection between the memory storage device and a host system is established. First check data is generated according to first data. The first check data is maintained in the memory storage device. A cross-device write command is sent through the connection. The cross-device write command is used to instruct execution of cross-device writing, and the cross-device writing is used to store the first data into a memory in the host system. After the cross-device write command is sent, a cross-device read command is sent through the connection. The cross-device read command is used to instruct execution of cross-device reading, and the cross-device reading is used to read back the first data from the memory in the host system. In response to the cross-device reading meeting a check trigger condition, a first check operation is performed on the first data read back from the memory in the host system according to the check data to check whether the first data read back from the memory in the host system is abnormal. In response to the cross-device reading not meeting the check trigger condition, the first check operation is skipped.

An exemplary embodiment of the disclosure further provides a memory storage device, including a connection interface unit, a rewritable non-volatile memory module, and a memory control circuit unit. The connection interface unit is configured to be coupled to a host system. The memory control circuit unit is coupled to the connection interface unit and the rewritable non-volatile memory module. The memory control circuit unit is configured to establish a connection between the memory storage device and the host system, generate check data according to first data, maintain the check data in the memory storage device, send a cross-device write command through the connection, in which the cross-device write command is used to instruct execution of cross-device writing, and the cross-device writing is used to store the first data into a memory in the host system, send a cross-device read command through the connection after sending the cross-device write command, in which the cross-device read command is used to instruct execution of cross-device reading, and the cross-device reading is used to read back the first data from the memory in the host system, in response to the cross-device reading meeting a check trigger condition, perform a first check operation on the first data read back from the memory in the host system according to the check data to check whether the first data read back from the memory in the host system is abnormal, and in response to the cross-device reading not meeting the check trigger condition, skip the first check operation.

An exemplary embodiment of the disclosure further provides a memory control circuit unit, configured to control a memory storage device. The memory storage device includes a rewritable non-volatile memory module. The memory control circuit unit includes a host interface, a memory interface, and a memory management circuit. The host interface is configured to be coupled to a host system. The memory interface is configured to be coupled to the rewritable non-volatile memory module. The memory management circuit is coupled to the host interface and the memory interface. The memory management circuit is configured to establish a connection between the memory storage device and the host system, generate check data according to first data, maintain the check data in the memory storage device, send a cross-device write command through the connection, in which the cross-device write command is used to instruct execution of cross-device writing, and the cross-device writing is used to store the first data into a memory in the host system, send a cross-device read command through the connection after sending the cross-device write command, in which the cross-device read command is used to instruct execution of cross-device reading, and the cross-device reading is used to read back the first data from the memory in the host system, in response to the cross-device reading meeting a check trigger condition, perform a first check operation on the first data read back from the memory in the host system according to the check data to check whether the first data read back from the memory in the host system is abnormal, and in response to the cross-device reading not meeting the check trigger condition, skip the first check operation.

Based on the above, after the first check data is generated according to the first data, the first check data may be maintained in the memory storage device. After the connection between the memory storage device and the host system is established, the cross-device writing may be performed through the connection to store the first data into the memory in the host system. After the cross-device writing is performed, the cross-device reading may be performed through the connection to read back the first data from memory in the host system. In particular, in response to the cross-device reading meeting the check trigger condition, the check operation may be performed according to the first check data to check whether the first data read back from the memory in the host system is abnormal. However, in response to the read operation not meeting the check trigger condition, the check operation may be skipped (i.e., not performed). In this way, under the premise of not affecting the data access performance between the memory storage device and the host system as much as possible, the risk of the serious operating errors in the memory storage device due to the incorrect data being read from the memory in the host system may be effectively reduced.

DETAILED DESCRIPTION OF DISCLOSED EMBODIMENTS

Generally speaking, a memory storage device (also referred to as a memory storage system) includes a rewritable non-volatile memory module and a controller (also referred to as a control circuit). The memory storage device may be used with a host system, so that the host system may write data to the memory storage device or read the data from the memory storage device.

Figure 1:
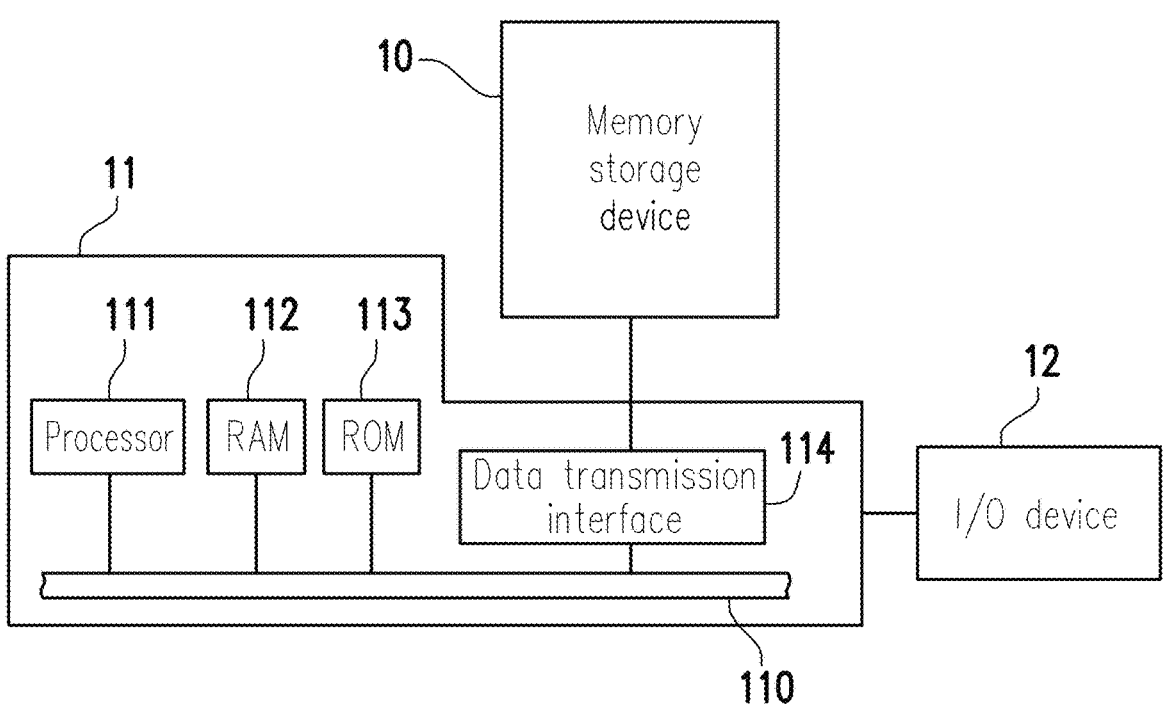
FIG. 1 is a schematic view of a host system, a memory storage device, and an input/output (I/O) device according to an exemplary embodiment of the disclosure.
Figure 2:
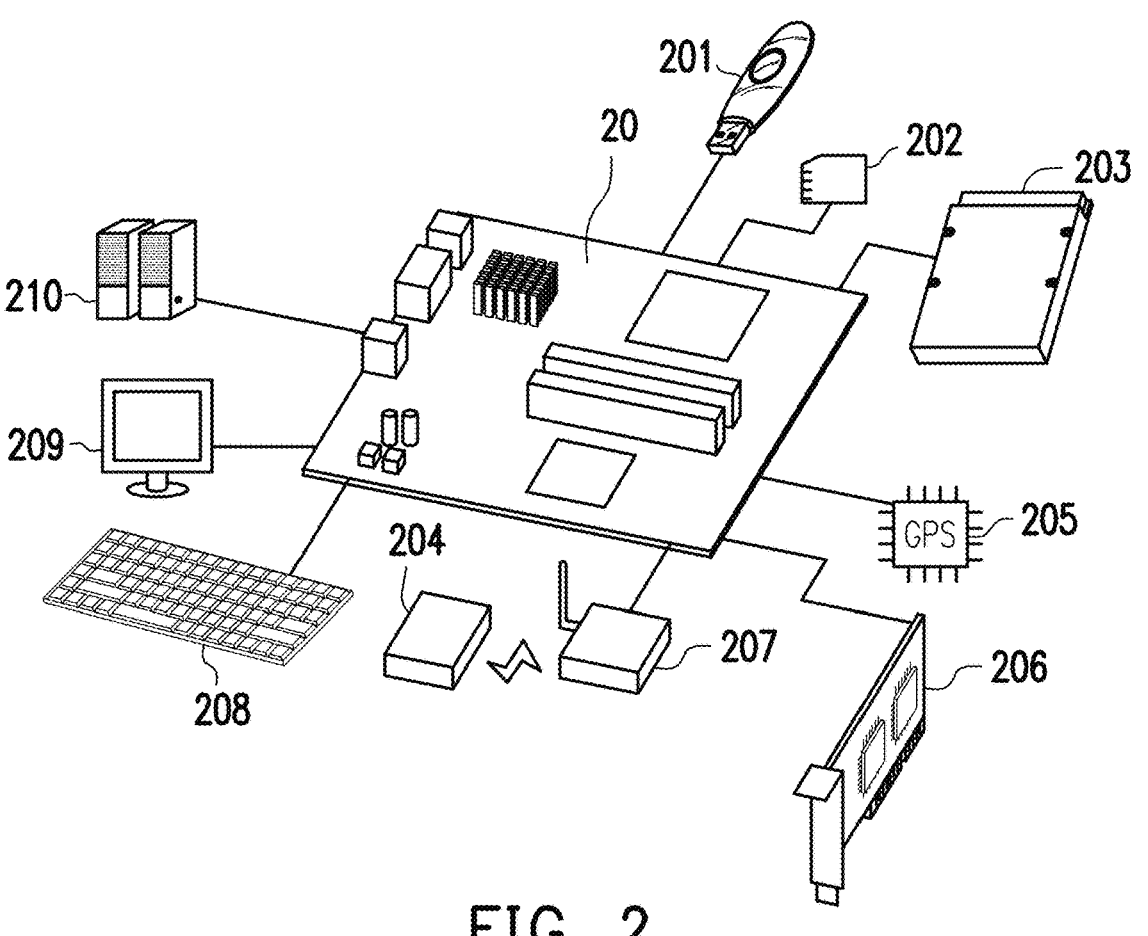
FIG. 2 is a schematic view of a host system, a memory storage device, and an I/O device according to an exemplary embodiment of the disclosure.

FIG. 1 is a schematic view of a host system, a memory storage device, and an input/output (I/O) device according to an exemplary embodiment of the disclosure. FIG. 2 is a schematic view of a host system, a memory storage device, and an I/O device according to an exemplary embodiment of the disclosure.

Referring to FIGS. 1 and 2, a host system 11 may include a processor 111, a random access memory (RAM) 112, a read only memory (ROM) 113, and a data transmission interface 114. The processor 111, the random access memory 112, the read only memory 113, and the data transmission interface 114 may be coupled to a system bus 110.

In an exemplary embodiment, the host system 11 may be coupled to a memory storage device 10 through the data transmission interface 114. For example, the host system 11 may store the data into the memory storage device 10 or read the data from the memory storage device 10 through the data transmission interface 114. In addition, the host system 11 may be coupled to an I/O device 12 through the system bus 110. For example, the host system 11 may transmit an output signal to the I/O device 12 or receive an input signal from the I/O device 12 through the system bus 110.

In an exemplary embodiment, the processor 111, the random access memory 112, the read only memory 113, and the data transmission interface 114 may be disposed on a motherboard 20 of the host system 11. The number of data transmission interfaces 114 may be one or more. Through the data transmission interface 114, the motherboard 20 may be coupled to the memory storage device 10 through in a wired or wireless manner.

In an exemplary embodiment, the memory storage device 10 may be, for example, a flash drive 201, a memory card 202, a solid state drive (SSD) 203, or a wireless memory storage device 204. The wireless memory storage device 204 may be, for example, memory storage devices based on various wireless communication technologies such as a near field communication (NFC) memory storage device, a WiFi memory storage device, a Bluetooth memory storage device, or a low-power Bluetooth memory storage device (e.g., iBeacon). In addition, the motherboard 20 may also be coupled to various I/O devices such as a global positioning system (GPS) module 205, a network interface card 206, a wireless transmission device 207, a keyboard 208, a screen 209, and a speaker 210 through the system bus 110. For example, in an exemplary embodiment, the motherboard 20 may access the wireless memory storage device 204 through the wireless transmission device 207.

In an exemplary embodiment, the host system 11 is a computer system. In an exemplary embodiment, the host system 11 may be any system that may substantially cooperate with the memory storage device to store the data. In an exemplary embodiment, the memory storage device 10 and the host system 11 may respectively include a memory storage device 30 and a host system 31 in FIG. 3.

Figure 3:
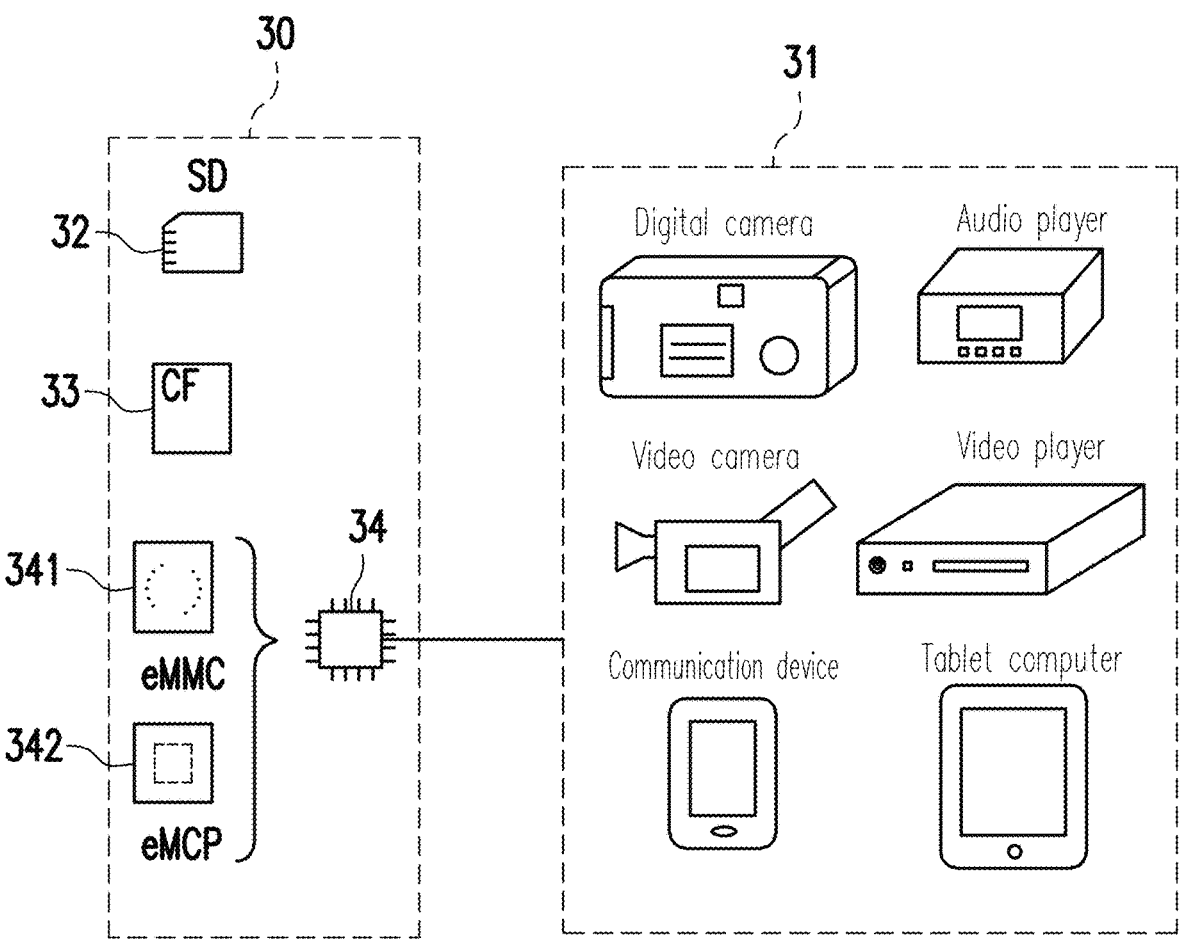
FIG. 3 is a schematic view of a host system and a memory storage device according to an exemplary embodiment of the disclosure.

FIG. 3 is a schematic view of a host system and a memory storage device according to an exemplary embodiment of the disclosure. Referring to FIG. 3, the memory storage device 30 may be used in conjunction with the host system 31 to store the data. For example, the host system 31 may be systems such as a digital camera, a video camera, a communication device, an audio player, a video player, or a tablet computer. For example, the memory storage device 30 may be various non-volatile memory storage devices such as a secure digital (SD) card 32, a compact flash (CF) card 33, or an embedded storage device 34 used by the host system 31. The embedded storage device 34 includes various types of embedded storage devices that directly couple memory modules to a substrate of the host system, such as an embedded multi media card (eMMC) 341 and/or an embedded multi chip package (eMCP) storage device 342.

Figure 4:
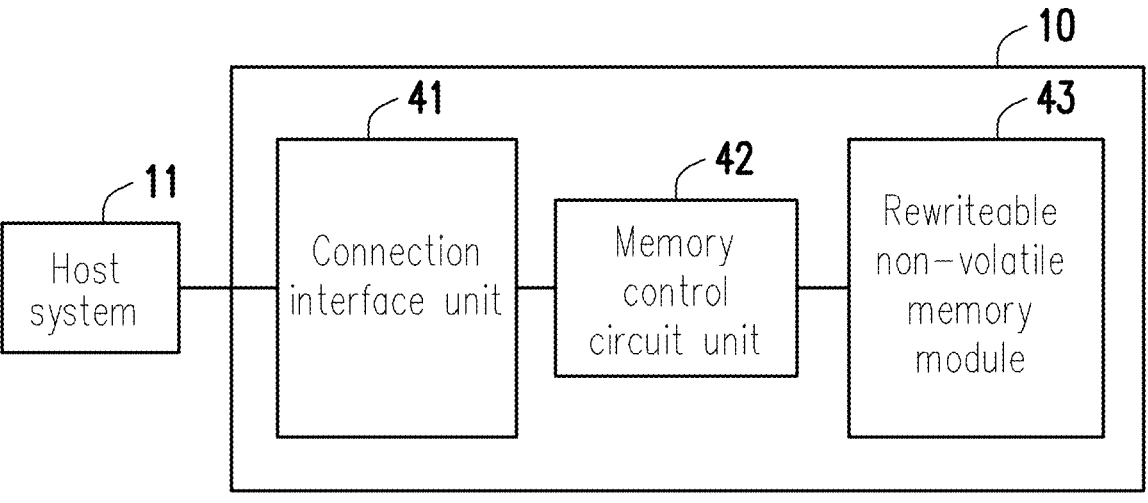
FIG. 4 is a schematic view of a memory storage device according to an exemplary embodiment of the disclosure.

FIG. 4 is a schematic view of a memory storage device according to an exemplary embodiment of the disclosure. Referring to FIG. 4, the memory storage device 10 includes a connection interface unit 41, a memory control circuit unit 42, and a rewritable non-volatile memory module 43.

The connection interface unit 41 is configured to be coupled to the host system 11. The memory storage device 10 may communicate with the host system 11 through the connection interface unit 41. In an exemplary embodiment, the connection interface unit 41 is compatible with the peripheral component interconnect express (PCI Express) standard. In an exemplary embodiment, the connection interface unit 41 may also complies with the serial advanced technology attachment (SATA) standard, the parallel advanced technology attachment (PATA) standard, the institute of electrical and electronic engineers (IEEE) 1394 standard, the universal serial bus (USB) standard, the SD interface standard, the ultra high speed-I (UHS-I) interface standard, the ultra high speed-II (UHS-II) interface standard, the memory stick (MS) interface standard, the MCP interface standard, the MMC interface standard, the eMMC interface standard, the universal flash storage (UFS) interface standard, the eMCP interface standard, the CF interface standard, the integrated device electronics (IDE) standard, or other suitable standards. The connection interface unit 41 and the memory control circuit unit 42 may be packaged in a chip, or the connection interface unit 41 may be arranged outside a chip including the memory control circuit unit 42.

The memory control circuit unit 42 is coupled to the connection interface unit 41 and the rewritable non-volatile memory module 43. The memory control circuit unit 42 is configured to execute multiple logic gates or control commands implemented in a form of hardware or a form of firmware, and perform operations such as data writing, reading, and erasing in the rewritable non-volatile memory module 43 according to a command of the host system 11.

The rewritable non-volatile memory module 43 is configured to store the data written by the host system 11. The rewritable non-volatile memory module 43 may include a single level cell (SLC) NAND flash memory module (that is, a flash memory module that may store 1 bit in one memory cell), a multi level cell (MLC) NAND flash memory module (that is, a flash memory module that may store 2 bits in one memory cell), a triple level cell (TLC) NAND flash memory module (that is, a flash memory module that may store 3 bits in one memory cell), a quad level cell (QLC) NAND flash memory module (that is, a flash memory module that may store 4 bits in one memory cell), other flash memory modules, or other memory modules with the same characteristics.

Each of memory cells in the rewritable non-volatile memory module 43 stores one or more bits based on changes in a voltage (hereinafter also referred to as a threshold voltage). Specifically, there is a charge trapping layer between a control gate and a channel of each of the memory cells. By applying a write voltage to the control gate, the number of electrons in the charge trapping layer may be changed, thereby changing the threshold voltage of the memory cell. The operation of changing the threshold voltage of the memory cell is also referred to as "writing data into the memory cell" or "programming the memory cell". As the threshold voltage changes, each of the memory cells in the rewritable non-volatile memory module 43 has multiple storage states. By applying a read voltage, it is possible to determine which storage state one memory cell belongs to, thereby obtaining the one or more bits stored into the memory cell.

In an exemplary embodiment, the memory cells of the rewritable non-volatile memory module 43 may constitute multiple physical programming units, and the physical programming units may constitute multiple physical erasing units. Specifically, the memory cells on the same word line may form one or more physical programming units. If each of the memory cells may store more than 2 bits, the physical programming units on the same word line may be at least classified into lower physical programming units and upper physical programming units. For example, a least significant bit (LSB) of one memory cell belongs to the lower physical programming unit, and a most significant bit (MSB) of one memory cell belongs to the upper physical programming unit. Generally speaking, in the MLC NAND flash memory, a write speed of the lower physical programming unit is greater than a write speed of the upper physical programming unit, and/or reliability of the lower physical programming unit is higher than reliability of the upper physical programming unit.

In an exemplary embodiment, the physical programming unit is the smallest unit of programming. That is, the physical programming unit is the smallest unit of writing data. For example, the physical programming unit may be a physical page or a physical sector. If the physical programming unit is a physical page, the physical programming units may include a data bit area and a redundancy bit area. The data bit area includes multiple physical sectors to store user data, while the redundancy bit area is configured to store system data (e.g., management data such as error correction codes). In an exemplary embodiment, the data bit area includes 32 physical sectors, and a size of one physical sector is 512 bytes (B). However, in other exemplary embodiments, the data bit area may also include 8, 16, or more or less physical sectors, and the size of each of the physical sectors may also be greater or smaller. On the other hand, the physical erasing unit is the smallest unit of erasing. That is, each of the physical erasing units includes the smallest number of memory cells to be erased together. For example, the physical erasing unit is a physical block.

Figure 5:
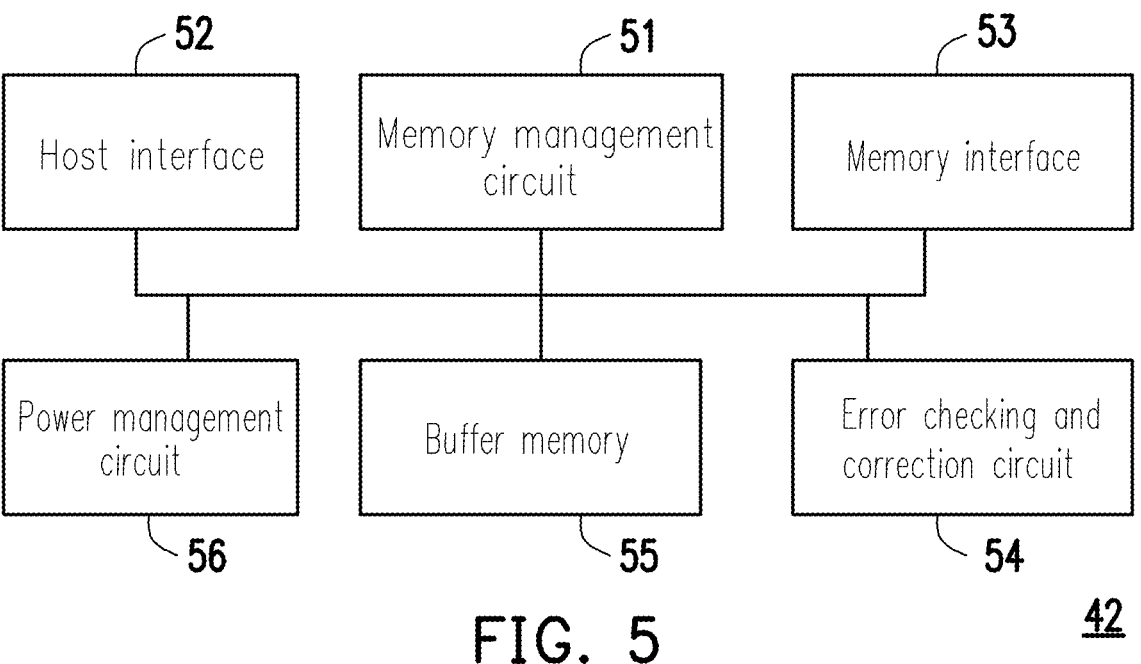
FIG. 5 is a schematic view of a memory control circuit unit according to an exemplary embodiment of the disclosure.

FIG. 5 is a schematic view of a memory control circuit unit according to an exemplary embodiment of the disclosure. Referring to FIG. 5, the memory control circuit unit 42 includes a memory management circuit 51, a host interface 52, and a memory interface 53.

The memory management circuit 51 is configured to control an overall operation of the memory control circuit unit 42. Specifically, the memory management circuit 51 has multiple control commands, and when the memory storage device 10 is operating, the control commands are executed to perform the operations such as data writing, reading, and erasing. The following description of the operation of the memory management circuit 51 is equivalent to the description of the operation of the memory control circuit unit 42 and the memory storage device 10.

In an exemplary embodiment, the control commands of the memory management circuit 51 are implemented in the form of firmware. For example, the memory management circuit 51 has a microprocessor unit (not shown) and a read only memory (not shown), and the control commands are burned into the read only memory. When the memory storage device 10 is operating, the control commands are executed by the microprocessor unit to perform the operations such as data writing, reading, and erasing.

In an exemplary embodiment, the control commands of the memory management circuit 51 may also be stored into a specific area (e.g., a system area in the memory module dedicated to storing the system data) of the rewritable non-volatile memory module 43 in a form of program codes. In addition, the memory management circuit 51 has a microprocessor unit (not shown), a read only memory (not shown), and a random access memory (not shown). In particular, the read only memory has a boot code, and when the memory control circuit unit 42 is enabled, the microprocessor unit first executes the boot code to load the control commands stored into the rewritable non-volatile memory module 43 into the random access memory of the memory management circuit 51. Afterwards, the microprocessor unit runs the control commands to perform the operations such as data writing, reading, and erasing.

In an exemplary embodiment, the control commands of the memory management circuit 51 may also be implemented in the form of hardware. For example, the memory management circuit 51 includes a microcontroller, a memory cell management circuit, a memory writing circuit, a memory reading circuit, a memory erasing circuit, and a data processing circuit. The memory cell management circuit, the memory writing circuit, the memory reading circuit, the memory erasing circuit, and the data processing circuit are coupled to the microcontroller. The memory cell management circuit is configured to manage the memory cells or memory cell groups of the rewritable non-volatile memory module 43. The memory writing circuit is configured to issue a write command sequence to the rewritable non-volatile memory module 43 to write the data into the rewritable non-volatile memory module 43. The memory reading circuit is configured to issue a read command sequence to the rewritable non-volatile memory module 43 to read the data from the rewritable non-volatile memory module 43. The memory erasing circuit is configured to issue an erase command sequence to the rewritable non-volatile memory module 43 to erase the data from the rewritable non-volatile memory module 43. The data processing circuit is configured to process the data to be written into the rewritable non-volatile memory module 43 and the data read from the rewritable non-volatile memory module 43. The write command sequence, the read command sequence, and the erase command sequence may each include one or more program codes or command codes, and are configured to instruct the rewritable non-volatile memory module 43 to perform the corresponding operations such as writing, reading, and erasing. In an exemplary embodiment, the memory management circuit 51 may further issue other types of command sequences to the rewritable non-volatile memory module 43 to instruct execution of the corresponding operations.

The host interface 52 is coupled to the memory management circuit 51. The memory management circuit 51 may communicate with the host system 11 through the host interface 52. The host interface 52 may be configured to obtain and identify commands and data transmitted by the host system 11. For example, the commands and the data transmitted by the host system 11 may be transmitted to the memory management circuit 51 through the host interface 52. In addition, the memory management circuit 51 may transmit the data to the host system 11 through the host interface 52. In this exemplary embodiment, the host interface 52 is compatible with the PCI Express standard. However, it is required to be understood that the disclosure is not limited thereto. The host interface 52 may also be compatible with the SATA standard, the PATA standard, the IEEE 1394 standard, the USB standard, the SD standard, the UHS-I standard, the UHS-II standard, the MS standard, the MMC standard, the eMMC standard, the UFS standard, the CF standard, the IDE standard, or other suitable data transmission standards.

The memory interface 53 is coupled to the memory management circuit 51, and is configured to access the rewritable non-volatile memory module 43. For example, the memory management circuit 51 may access the rewritable non-volatile memory module 43 through the memory interface 53. That is to say, the data to be written into the rewritable non-volatile memory module 43 is converted into a format acceptable to the rewritable non-volatile memory module 43 through the memory interface 53. Specifically, if the memory management circuit 51 is about to access the rewritable non-volatile memory module 43, the memory interface 53 transmits a corresponding command sequence. For example, the command sequences may include the write command sequence instructing to write the data, the read command sequence instructing to read the data, the erase command sequence instructing to erase the data, and corresponding command sequences to instruct various memory operations (e.g., changing a read voltage level or performing a garbage collection (GC) operation, etc.). The command sequences are generated, for example, by the memory management circuit 51 and transmitted to the rewritable non-volatile memory module 43 through the memory interface 53. The command sequences may include one or more signals or data on a bus. The signals or the data may include command codes or program codes. For example, the read command sequence includes information such as an identification code for reading and a memory address.

In an exemplary embodiment, the memory control circuit unit 42 further includes an error detecting and correcting circuit 54, a buffer memory 55, and a power management circuit 56. The error detecting and correcting circuit 54 is coupled to the memory management circuit 51, and is configured to perform an error detecting and correcting operation to ensure accuracy of the data. Specifically, when the memory management circuit 51 obtains a write command from the host system 11, the error detecting and correcting circuit 54 generates a corresponding error correcting code (ECC) and/or error detecting code (EDC) for the data corresponding to the write command, and the memory management circuit 51 writes the data corresponding to the write command and the corresponding error correcting code and/or error detecting code to the rewritable non-volatile memory module 43. Afterwards, when the memory management circuit 51 reads the data from the rewritable non-volatile memory module 43, it also reads the error correcting code and/or error detecting code corresponding to the data, and the error detecting and correcting circuit 54 performs the error detecting and correcting operation on the read data according to the error correcting code and/or the error detecting code. For example, the error detecting and correcting circuit 54 may encode and decode the data by using various encoding/decoding algorithms such as a low density parity check code (LDPC code), a BCH code, a Reed-solomon code (RS code), and an exclusive OR (XOR) code.

The buffer memory 55 is coupled to the memory management circuit 51, and is configured to temporarily store the data. The power management circuit 56 is coupled to the memory management circuit 51, and is configured to control a power supply of the memory storage device 10.

In an exemplary embodiment, the rewritable non-volatile memory module 43 in FIG. 4 may include a flash memory module. In an exemplary embodiment, the memory control circuit unit 42 in FIG. 4 may include a flash memory controller. In an exemplary embodiment, the memory management circuit 51 in FIG. 5 may include a flash memory management circuit.

Figure 6:
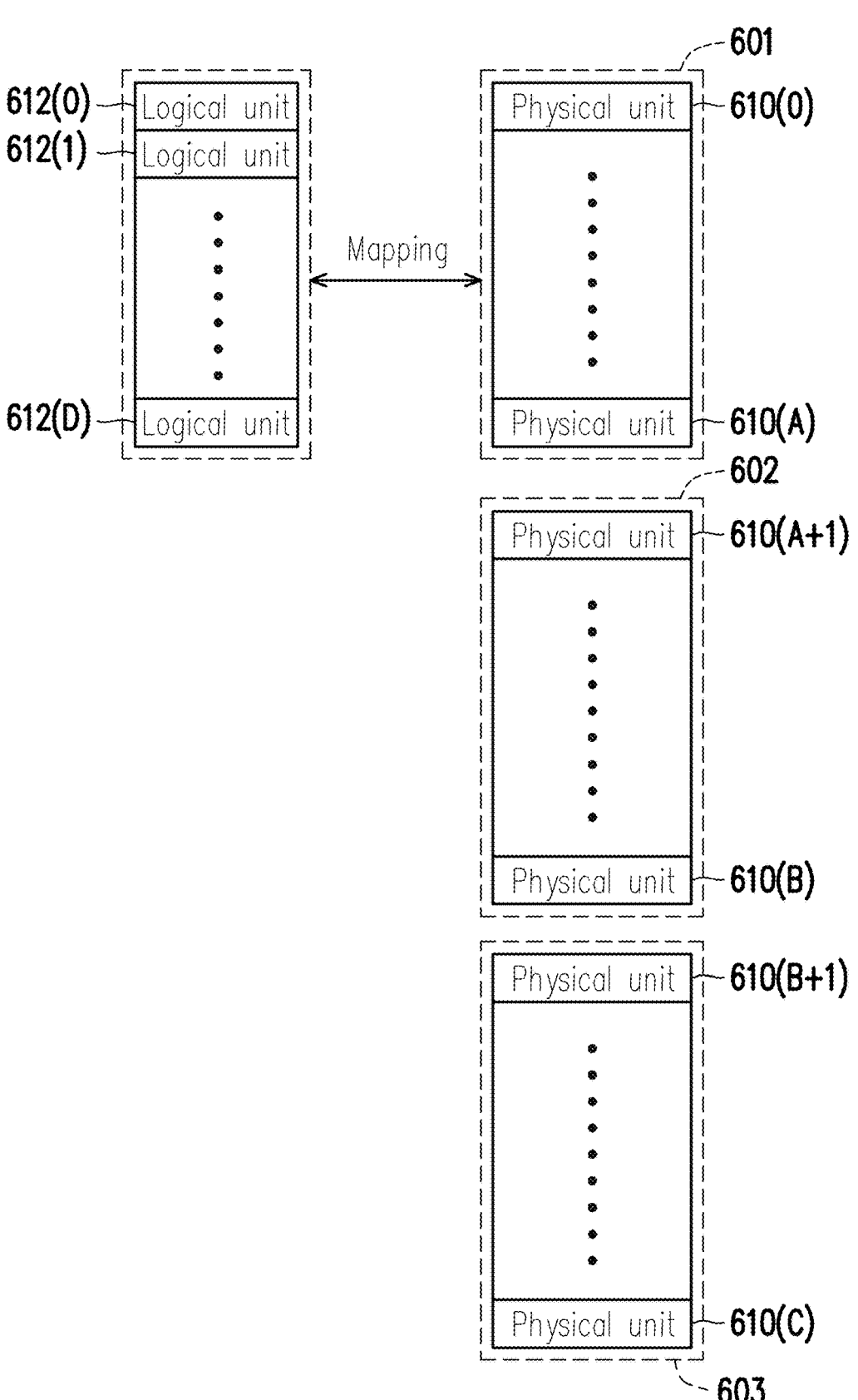
FIG. 6 is a schematic view of managing a rewritable non-volatile memory module according to an exemplary embodiment of the disclosure.

FIG. 6 is a schematic view of managing a rewritable non-volatile memory module according to an exemplary embodiment of the disclosure. Referring to FIG. 6, the memory management circuit 51 may logically group physical units 610(0) to 610(C) in the rewritable non-volatile memory module 43 into a storage area 601, a spare area 602, and a system area 603.

In an exemplary embodiment, one physical unit refers to one physical address or one physical programming unit. In an exemplary embodiment, one physical unit may also be formed by multiple consecutive or non-consecutive physical addresses. In an exemplary embodiment, one physical unit may also refer to one virtual block (VB). One virtual block may include multiple physical addresses or multiple physical programming units. In an exemplary embodiment, one virtual block may include one or more physical erasing units.

In an exemplary embodiment, the physical units 610(0) to 610(A) in the storage area 601 are configured to store user data (e.g., user data from the host system 11 in FIG. 1). For example, the physical units 610(0) to 610(A) in the storage area 601 may store valid data and invalid data. The physical units 610(A+1) to 610(B) in the spare area 602 do not store the data (e.g., the valid data). For example, if a certain physical unit does not store the valid data, the physical unit may be associated (or added) to the spare area 602. In addition, the physical units (or the physical units that do not store the valid data) in the spare area 602 may be erased. When new data is written, one or more physical units may be retrieved from the spare area 602 to store the new data. In an exemplary embodiment, the spare area 602 is also referred to as a free pool.

In an exemplary embodiment, the memory management circuit 51 may disposed logical units 612(0) to 612(D) to map the physical units 610(0) to 610(A) in the storage area 601. In an exemplary embodiment, each of the logical units corresponds to a logical address. For example, one logical address may include one or more logical block addresses (LBA) or other logical management units. In an exemplary embodiment, one logical unit may also correspond to a logical programming unit or be formed by multiple consecutive or non-consecutive logical addresses.

It should be noted that one logical unit may be mapped to one or more physical units. If a certain physical unit is currently mapped by a certain logical unit, it means that the data currently stored in the physical unit includes the valid data. On the contrary, if a certain physical unit is not currently mapped by any one of the logical units, it means that the data currently stored in the physical unit is the invalid data.

In an exemplary embodiment, the memory management circuit 51 may record management data (also referred to as logical-to-physical mapping information) describing a mapping relationship between the logical units and the physical units in at least one logical-to-physical mapping table (L2P table). When the host system 11 is about to read the data from or write the data into the memory storage device 10, the memory management circuit 51 may access the rewritable non-volatile memory module 43 according to the information in the logical-to-physical mapping table.

In an exemplary embodiment, the memory management circuit 51 may store specific types of data in the system area 603. For example, the physical units 610(B+1) to 610(C) in the system area 603 may be dedicated to storing data of higher importance and/or data that is not intended to be accessed or modified by the host system 11. For example, the data of higher importance and/or the data that is not intended to be accessed or modified by the host system 11 may include the logical-to-physical mapping table, a bad block management table, a wear-leveling management table, a valid data management table, and/or other types of management data, and the disclosure is not limited thereto. The logical-to-physical mapping table is used to record mapping information. The mapping information may reflect the mapping relationship between the logical units and the physical units. The bad block management table is used to record information related to at least one bad block in the rewritable non-volatile memory module 43. The wear-leveling management table may be used to record information (e.g., read counts, write counts, and/or erase counts) related to a wear state of at least one of the physical units in the rewritable non-volatile memory module 43. The valid data management table may be used to record information related to valid counts of at least one of the physical units in the rewritable non-volatile memory module 43.

In an exemplary embodiment, the memory management circuit 51 may not map any logical unit to the physical units in the system area 603. In this way, the data stored into system area 603 may be prevented from being accessed or modified by the host system 11.

Figure 7:
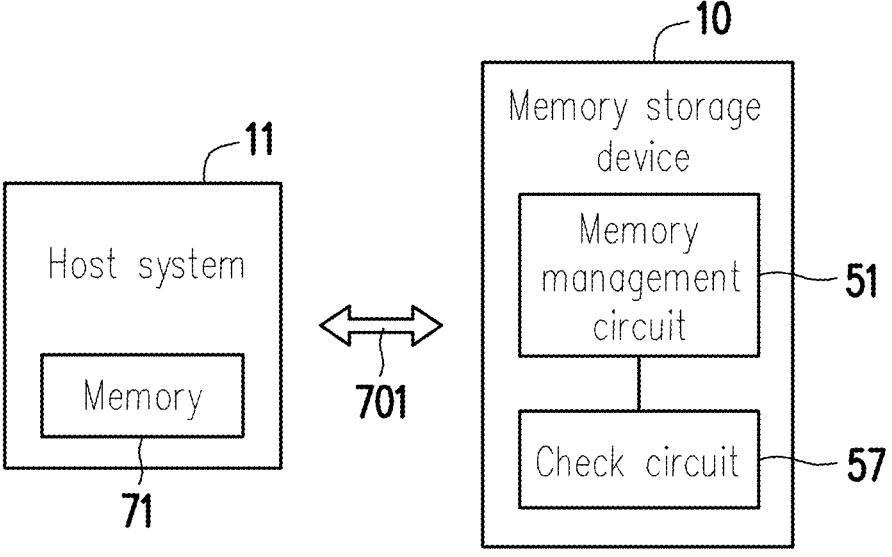
FIG. 7 is a schematic view of a host system and a memory storage device according to an exemplary embodiment of the disclosure.

FIG. 7 is a schematic view of a host system and a memory storage device according to an exemplary embodiment of the disclosure. Referring to FIG. 7, in an exemplary embodiment, both the host system 11 and the memory storage device 10 support the host memory buffering (HMB) technology. Under a HMB architecture, the host system 11 may provide a memory 71 to the memory storage device 10 for use. For example, the memory 71 may include a random access memory and/or other types of memories. The memory 71 may be configured to temporarily store the data. It should be noted that the disclosure does not limit the total number, capacity, and types of memories in the memory 71.

In an exemplary embodiment, the memory management circuit 51 may establish a connection 701 between the memory storage device 10 and the host system 11. For example, the memory management circuit 51 may perform a handshake operation with the host system 11 to establish the connection 701. After the connection 701 is established, the memory management circuit 51 may access the memory 71 (e.g., store the data into the memory 71 or read the data from the memory 71) and communicate with the host system 11 through the connection 701. In an exemplary embodiment, the connection 701 between the memory storage device 10 and the host system 11 complies with the NVM Express (NVMe) specification.

In an exemplary embodiment, the memory management circuit 51 may receive a request from the host system 11. The request is used to ask whether the memory storage device 10 supports the HMB technology. The memory management circuit 51 may provide a response to the host system 11 according to the request. The response may inform the host system 11 whether the memory storage device 10 supports the HMB technology.

In an exemplary embodiment, if the memory storage device 10 supports the HMB technology, the host system 11 may enable or dispose the memory 71 for access by the memory storage device 10 according to the response. In an exemplary embodiment, if the memory storage device 10 does not support the HMB technology, the host system 11 may not enable or dispose the memory 71. In an exemplary embodiment, if the memory storage device 10 supports the HMB technology, the response may also inform the host system 11 of parameters related to the HMB technology such as the memory space required to execute the HMB technology. The host system 11 may enable or dispose the memory 71 according to the response.

In an exemplary embodiment, the memory 71 may be configured to replace at least a portion of the buffer memory (e.g., the buffer memory 55 in FIG. 5) in the memory storage device 10. In an exemplary embodiment, the memory 71 may be used with the at least a portion of the buffer memory (e.g., the buffer memory 55 in FIG. 5) in the memory storage device 10 for use by the memory management circuit 51. In an exemplary embodiment, the memory management circuit 51 may use the memory 71 instead of the at least a portion of the buffer memory (e.g., the buffer memory 55 of FIG. 5) in the memory storage device 10. In an exemplary embodiment, when the memory management circuit 51 may use the memory 71, the memory storage device 10 may not be provided with any buffer memory (e.g., the buffer memory 55 in FIG. 5) or, the capacity of the buffer memory disposed in the memory storage device 10 may be reduced. In this way, construction costs of the memory storage device 10 may be reduced.

In an exemplary embodiment, the memory management circuit 51 may generate check data (also referred to as first check data) according to specific data (also referred to as first data). The first check data may be used to check whether the first data is abnormal. In an exemplary embodiment, the memory management circuit 51 may encode the first data to generate the first check data. In an exemplary embodiment, an operation of checking whether the first data is abnormal may include checking data integrity of the first data. In an exemplary embodiment, the memory management circuit 51 may encode the first data to generate the first check data by using the exclusive OR (XOR) code or other types of encoding algorithms.

In an exemplary embodiment, after generating the first check data, the memory management circuit 51 may maintain the first check data in the memory storage device 10. For example, the memory management circuit 51 may store the first check data into the buffer memory 55 or the rewritable non-volatile memory module 43 to wait for subsequent use.

In an exemplary embodiment, after generating the first check data, the memory management circuit 51 may update at least a portion of the first data (also referred to as first partial data). For example, the amount of data of the updated first partial data may be less than or equal to the total amount of data of the first data. Then, the memory management circuit 51 may update the first check data according to the updated first partial data (or the updated first data).

In an exemplary embodiment, the memory management circuit 51 may update the first check data only according to the updated first partial data. In addition, in an exemplary embodiment, the memory management circuit 51 may also update the first check data according to the updated complete first data. In this way, the updated first check data may be used to check whether the updated first data is abnormal.

In an exemplary embodiment, the first data may carry the mapping information. For example, the first data may include one or more logical-to-physical mapping tables that are read from the system area 603 or to be stored into the system area 603. In an exemplary embodiment, the first data may also include other types of management data read from the system area 603 or to be stored into the system area 603.

In an exemplary embodiment, the memory management circuit 51 may obtain a command from the host system 11. The command may be used to instruct the memory storage device 10 to perform a specific operation. In an exemplary embodiment, the memory management circuit 51 may update the first partial data in the first data according to the command. For example, the command may include a write command, a delete command, or other types of commands, and the disclosure is not limited thereto.

In an exemplary embodiment, according to the write command obtained from the host system 11, the memory management circuit 51 may write the data carried by the write command into a specific physical unit and update the mapping information corresponding to the physical unit in the first data. In this way, the updated first data may carry new mapping information corresponding to the physical unit. For example, the new mapping information may reflect the mapping relationship between the physical unit and at least one of the logical units.

In an exemplary embodiment, according to the delete command obtained from the host system 11, the memory management circuit 51 may delete the data indicated by the delete command from a specific logical unit and update the mapping information corresponding to the logical unit in the first data. In this way, the updated first data may carry new mapping information corresponding to the logical unit. For example, the new mapping information may reflect that the logical unit is not mapped to any physical unit. In an exemplary embodiment, the memory management circuit 51 may further update the first data according to other types of commands, and the disclosure is not limited thereto.

In an exemplary embodiment, the memory management circuit 51 may perform a data write operation (also referred to as cross-device writing) in the host system 11 through the connection 701. In an exemplary embodiment, the memory management circuit 51 may send a data write command (also referred to as a cross-device write command) to the host system 11 through the connection 701. The cross-device write command is used to instruct execution of the cross-device writing on the host system 11 through the connection 701. Specifically, the cross-device writing is used to store the first data into the memory 71 in the host system 11 through the connection 701. In an exemplary embodiment, through the cross-device writing, the memory management circuit 51 may completely store the first data into the memory 71 in the host system 11.

In an exemplary embodiment, after the first data is completely stored into the memory 71 in the host system 11, in response to the first partial data in the first data being updated, the memory management circuit 51 may perform the cross-device writing again (e.g., send the cross-device write command again) for the first data. It should be noted that repeated execution of the cross-device writing may store only the updated first partial data in the first data into the memory 71 in the host system 11, while the remaining data in the first data that is not updated is not required to be repeatedly transmitted to the host system 11. In this way, occupation of transmission bandwidths between the memory storage device 10 and the host system 11 may be reduced.

In an exemplary embodiment, after sending the cross-device write command to store the at least a portion of the first data into the memory 71 in the host system 11, the memory management circuit 51 may perform a data read operation (also referred to as cross-device reading) on the host system 11 through the connection 701. In an exemplary embodiment, the memory management circuit 51 may send a data read command (also referred to as a cross-device read command) to the host system 11 through the connection 701. The cross-device read command is used to instruct execution of the cross-device reading on the host system 11 through the connection 701. In particular, the cross-device reading is used to read back the first data from the memory 71 in the host system 11 through the connection 701.

In an exemplary embodiment, after reading back the first data from the memory 71 in the host system 11, the memory management circuit 51 may determine whether the cross-device reading meets a specific condition (also referred to as a check trigger condition). In an exemplary embodiment, in response to the cross-device reading meeting the check trigger condition, the memory management circuit 51 may perform a check operation (also referred to as a first check operation) on the first data read back from the memory 71 in the host system 11 according to the first check data. In particular, the first check operation is used to check whether the first data read back from the memory 71 in the host system 11 is abnormal. In addition, from another perspective, the first check operation may be used to check whether the first data read back from the memory 71 in the host system 11 meets requirements for the data integrity. In an exemplary embodiment, in response to the cross-device reading not meeting the check trigger condition, the memory management circuit 51 may skip (i.e. not perform) the first check operation.

In an exemplary embodiment, if at least a portion of data content of the first data read back from the memory 71 in the host system 11 is different from at least a portion of data content of the first data previously stored into the memory 71 in the host system 11, a check result of the first check operation reflects that the first data read back from the memory 71 in the host system 11 is abnormal. However, if the data content of the first data read back from the memory 71 in the host system 11 is exactly the same as the data content of the first data previously stored into the memory 71 in the host system 11, the check result of the first check operation reflects that the first data read back from the memory 71 in the host system 11 is not abnormal.

In an exemplary embodiment, by only performing the first check operation on the read-back first data at a relatively critical time point (that is, when the cross-device reading meets the check trigger condition), under the premise of not affecting data access performance between the memory storage device 10 and the host system 11 as much as possible, a risk of serious operating errors in the memory storage device 10 due to incorrect data being read from the memory 71 in the host system 11 may be effectively reduced.

In an exemplary embodiment, in the first check operation, the memory management circuit 51 may encode the first data read back from the memory 71 in the host system 11 to obtain verification data (also referred to as first verification data). The memory management circuit 51 may determine whether the first verification data is the same as the first check data. If the first verification data is the same as the first check data, the memory management circuit 51 may determine that the first data read back from the memory 71 in the host system 11 is not abnormal. However, if the first verification data is different from the first check data, the memory management circuit 51 may determine that the first data read back from the memory 71 in the host system 11 is abnormal.

In an exemplary embodiment, in the first check operation, the memory management circuit 51 may input the first check data and the first data read back from the memory 71 in the host system 11 to a specific algorithm. Then, the memory management circuit 51 may determine whether the read-back first data is abnormal according to an output of the algorithm. However, the disclosure does not limit operation details of the first check operation as long as it may be determined whether the data content of the first data read back from the memory 71 in the host system 11 is exactly the same as the data content of the first data previously stored into the memory 71 in the host system 11.

In an exemplary embodiment, after the first check operation is performed on the first data read back from the memory 71 in the host system 11, if the check result of the first check operation reflects that the read-back first data is abnormal, the memory management circuit 51 may discard the first data. In an exemplary embodiment, if the check result of the first check operation reflects that the read-back first data is abnormal, the memory management circuit 51 may further reconstruct the first data. For example, the memory management circuit 51 may read data that may be used to reconstruct the first data from the system area 603 and reconstruct the first data according to the data.

In an exemplary embodiment, if the check result of the first check operation reflects that the read-back first data is not abnormal (that is, the read-back first data is correct), the memory management circuit 51 may directly use the read-back first data to perform subsequent operations. In addition, in an exemplary embodiment, in response to the cross-device reading not meeting the check trigger condition, the memory management circuit 51 may also directly use the read-back first data to perform the subsequent operations.

In an exemplary embodiment, in response to the cross-device reading being to completely read back the first data from the memory 71 in the host system 11, the memory management circuit 51 may determine that the cross-device reading meets the check trigger condition. In an exemplary embodiment, if the cross-device reading is not to completely read back the first data from the memory 71 in host system 11 (for example, in the performed cross-device reading, only a portion of the first data is read back from the memory 71 in the host system 11), the memory management circuit 51 may determine that the cross-device reading does not meet the check trigger condition.

In an exemplary embodiment, before performing internal data management of the memory storage device 10 such as garbage collection, bad block management, or wear leveling, the memory management circuit 51 is required to read back the first data from the memory 71 in the host system 11. After reading back the first data from the memory 71 in the host system 11, the memory management circuit 51 may query the mapping information or other types of management information in the first data to perform the internal data management such as garbage collection, bad block management, or wear leveling on the memory storage device 10.

In an exemplary embodiment, in response to the cross-device reading being performed to perform the internal data management of the memory storage device 10 (e.g., the aforementioned garbage collection, bad block management, wear leveling, etc.), the memory management circuit 51 may determine that the cross-device reading meets the check trigger condition. In this way, it is possible to avoid the serious operating errors when the memory storage device 10 performs the internal data management due to the incorrect data being read from the memory 71 in the host system 11. However, if the cross-device reading is not performed to perform the internal data management of the memory storage device 10, the memory management circuit 51 may determine that the cross-device reading does not meet the check trigger condition. In this way, it is possible to avoid affecting the data access performance between the memory storage device 10 and the host system 11 due to excessively frequent execution of the first check operation.

In an exemplary embodiment, if the cross-device reading is performed to perform the internal data management of the memory storage device 10, through this cross-device read, after the first data is read back from the memory 71 in the host system 11 through the cross-device reading, and the check result of the first check operation reflects that the read-back first data is not abnormal, the memory management circuit 51 may store the read-back first data back into the rewritable non-volatile memory module 43 during the performed internal data management. For example, the memory management circuit 51 may store the read-back first data back into the system area 603.

In an exemplary embodiment, if the cross-device reading is performed to perform the internal data management of the memory storage device 10, after the first data is read back from the memory 71 in the host system 11 through the cross-device reading, and the check result of the first check operation reflects that the read-back first data is not abnormal, the memory management circuit 51 may create another data (also referred to as second data) based on the read-back first data during the performed internal data management. In particular, the second data may carry the mapping information or other types of management information. Then, the memory management circuit 51 can perform data migration in the rewritable non-volatile memory module 43 according to the second data. For example, depending on the type of the internal data management that is required to be performed, the memory management circuit 51 may create a second data with related information based on the read-back first data. Thereafter, the memory management circuit 51 may perform the internal data management involving the data migration in the rewritable non-volatile memory module 43 according to the second data, such as garbage collection, bad block management, or wear leveling.

In an exemplary embodiment, the memory control circuit unit 42 may further include a check circuit 57. The check circuit 57 is coupled to the memory management circuit 51. In an exemplary embodiment, the check circuit 57 may be configured to perform the aforementioned operation of generating the first check data according to the first data and/or the aforementioned first check operation. In an exemplary embodiment, the check circuit 57 may be included in the error detecting and correcting circuit 54 or independent of the error detecting and correcting circuit 54.

In an exemplary embodiment, regardless of whether the cross-device reading meets the check trigger condition, the error detecting and correcting circuit 54 may perform error detection or error correction on the first data read back from the memory 71 in the host system 11 through the cross-device reading to attempt to correct errors in the read-back first data. That is, in an exemplary embodiment, even if it is determined that the cross-device reading does not meet the check trigger condition, the error detecting and correcting circuit 54 still performs the error detection or error correction on the first data read back from the memory 71 in the host system 11 to attempt to correct the errors in the read-back first data.

Figure 8:
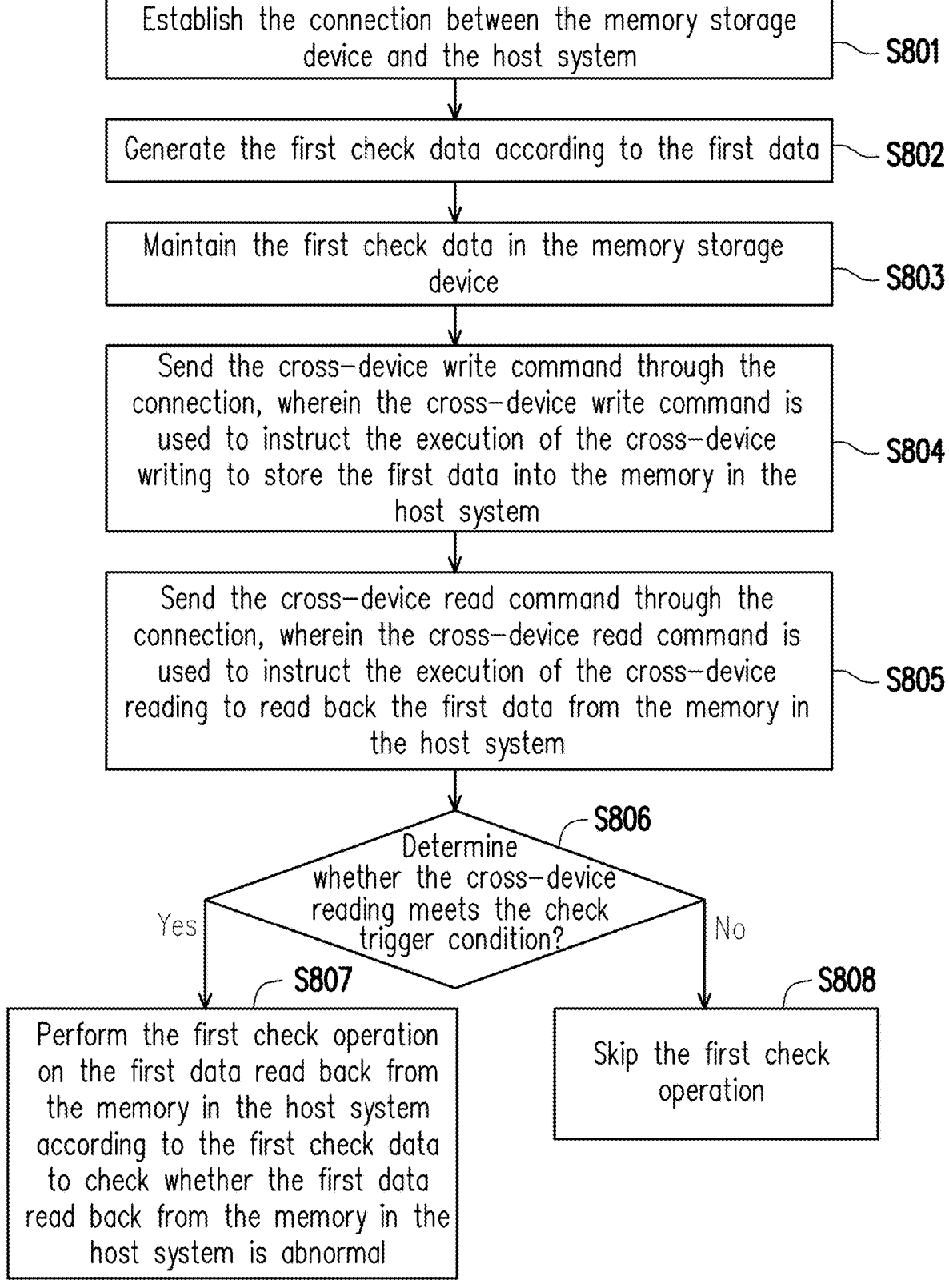
FIG. 8 is a flowchart of a data check method according to an exemplary embodiment of the disclosure.

FIG. 8 is a flowchart of a data check method according to an exemplary embodiment of the disclosure. Referring to FIG. 8, in step S801, the connection between the memory storage device and the host system is established. In step S802, the first check data is generated according to the first data. In step S803, the first check data is maintained in the memory storage device. In step S804, the cross-device write command is sent through the connection. The cross-device write command is used to instruct the execution of the cross-device writing to store the first data into the memory in the host system. In step S805, the cross-device read command is sent through the connection. The cross-device read command is used to instruct the execution of the cross-device reading to read back the first data from the memory in the host system. In step S806, it is determined whether the cross-device reading meets the check trigger condition. If the cross-device reading meets the check trigger condition, in step S807, the first check operation is performed on the first data read back from the memory in the host system according to the first check data to check whether the first data read back from the memory in the host system is abnormal. However, if the cross-device reading does not meet the check trigger condition, in step S808, the first check operation is skipped.

However, each of the steps in FIG. 8 has been described in detail above. Therefore, the same details will not be repeated in the following. It is worth noting that each of the steps in FIG. 8 may be implemented as multiple program codes or circuits, and the disclosure is not limited thereto. In addition, the method in FIG. 8 may be used in conjunction with the above exemplary embodiments or may be used alone, and the disclosure is not limited thereto.

Based on the above, in the data check method, the memory storage device, and the memory control circuit unit according to the exemplary embodiments of the disclosure, a data integrity check is only performed on the data read back from the memory in the host system at the relatively critical time point (that is, when the cross-device reading meets the check trigger condition). In this way, under the premise of not affecting the data access performance between the memory storage device and the host system as much as possible, the risk of the serious operating errors in the memory storage device due to the incorrect data being read from the memory in the host system may be effectively reduced.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A data check method for a memory storage device, wherein the data check method comprises:

performing a handshake operation with a host system to establish a connection between the memory storage device and the host system;

obtaining first data and then encoding the first data to generate check data;

maintaining the check data in the memory storage device;

sending a cross-device write command through the connection, wherein the cross-device write command is used to instruct execution of cross-device writing, and the cross-device writing is used to store the first data into a memory in the host system;

after sending the cross-device write command, sending a cross-device read command through the connection, wherein the cross-device read command is used to instruct execution of cross-device reading, and the cross-device reading is used to read back the first data from the memory in the host system;

determining whether the cross-device reading meets a check trigger condition based on at least one predefined decision logic;

in response to the cross-device reading meeting the check trigger condition, performing, by a check circuit in the memory storage device, a first check operation on the first data read back from the memory in the host system according to the check data to check whether the first data read back from the memory in the host system is abnormal; and in response to the cross-device reading not meeting the check trigger condition, skipping the first check operation.

2. The data check method according to claim 1, wherein a step of generating the check data comprises:

updating first partial data in the first data; and updating the check data according to the updated first partial data.

3. The data check method according to claim 2, wherein the first data has mapping information, and a step of updating the first partial data in the first data comprises:

updating the first partial data in the first data according to a command from the host system.

4. The data check method according to claim 2, wherein the cross-device writing is to only store the updated first partial data in the first data into the memory in the host system, and an amount of data of the first partial data is less than a total amount of data of the first data.

5. The data check method according to claim 1, further comprising:

in response to the cross-device reading being to completely read back the first data from the memory in the host system, determining that the cross-device reading meets the check trigger condition.

6. The data check method according to claim 1, further comprising:

in response to the cross-device reading being performed to perform internal data management of the memory storage device, determining that the cross-device reading meets the check trigger condition.

7. The data check method according to claim 6, wherein the internal data management comprises:

storing the first data read back from the memory in the host system back into a rewritable non-volatile memory module of the memory storage device.

8. The data check method according to claim 6, wherein the internal data management comprises:

creating second data according to the first data read back from the memory in the host system, wherein the second data has mapping information; and performing data migration in a rewritable non-volatile memory module of the memory storage device according to the second data.

9. A memory storage device, comprising:

a connection interface unit configured to be coupled to a host system;

a rewritable non-volatile memory module; and a memory control circuit unit coupled to the connection interface unit and the rewritable non-volatile memory module, wherein the memory control circuit unit is configured to:

perform a handshake operation with the host system to establish a connection between the memory storage device and the host system;

obtain first data and then encode the first data to generate check data;

maintain the check data in the memory storage device;

send a cross-device write command through the connection, wherein the cross-device write command is used to instruct execution of cross-device writing, and the cross-device writing is used to store the first data into a memory in the host system;

after sending the cross-device write command, send a cross-device read command through the connection, wherein the cross-device read command is used to instruct execution of cross-device reading, and the cross-device reading is used to read back the first data from the memory in the host system;

determine whether the cross-device reading meets a check trigger condition based on at least one predefined decision logic;

in response to the cross-device reading meeting the check trigger condition, perform, by a check circuit in the memory storage device, a first check operation on the first data read back from the memory in the host system according to the check data to check whether the first data read back from the memory in the host system is abnormal; and in response to the cross-device reading not meeting the check trigger condition, skip the first check operation.

10. The memory storage device according to claim 9, wherein an operation of the memory control circuit unit generating the check data comprises:

updating first partial data in the first data; and updating the check data according to the updated first partial data.

11. The memory storage device according to claim 10, wherein the first data has mapping information, and an operation of the memory control circuit unit updating the first partial data in the first data comprises:

updating the first partial data in the first data according to a command from the host system.

12. The memory storage device according to claim 10, wherein the cross-device writing is to only store the updated first partial data in the first data into the memory in the host system, and an amount of data of the first partial data is less than a total amount of data of the first data.

13. The memory storage device according to claim 9, wherein the memory control circuit unit is further configured to:

in response to the cross-device reading being to completely read back the first data from the memory in the host system, determine that the cross-device reading meets the check trigger condition.

14. The memory storage device according to claim 9, wherein the memory control circuit unit is further configured to:

in response to the cross-device reading being performed to perform internal data management of the memory storage device, determine that the cross-device reading meets the check trigger condition.

15. The memory storage device according to claim 14, wherein the internal data management comprises:

storing the first data read back from the memory in the host system back into a rewritable non-volatile memory module of the memory storage device.

16. The memory storage device according to claim 14, wherein the internal data management comprises:

creating second data according to the first data read back from the memory in the host system, wherein the second data has mapping information; and performing data migration in a rewritable non-volatile memory module of the memory storage device according to the second data.

17. A memory control circuit unit, configured to control a memory storage device, wherein the memory storage device comprises a rewritable non-volatile memory module, and the memory control circuit unit comprises:

a host interface configured to be coupled to a host system;

a memory interface configured to be coupled to the rewritable non-volatile memory module; and a memory management circuit coupled to the host interface and the memory interface, wherein the memory management circuit is configured to:

perform a handshake operation with the host system to establish a connection between the memory storage device and the host system;

obtain first data and then encode the first data to generate check data;

maintain the check data in the memory storage device;

send a cross-device write command through the connection, wherein the cross-device write command is used to instruct execution of cross-device writing, and the cross-device writing is used to store the first data into a memory in the host system;

after sending the cross-device write command, send a cross-device read command through the connection, wherein the cross-device read command is used to instruct execution of cross-device reading, and the cross-device reading is used to read back the first data from the memory in the host system;

determine whether the cross-device reading meets a check trigger condition based on at least one predefined decision logic;

in response to the cross-device reading meeting the check trigger condition, perform, by a check circuit in the memory storage device, a first check operation on the first data read back from the memory in the host system according to the check data to check whether the first data read back from the memory in the host system is abnormal; and in response to the cross-device reading not meeting the check trigger condition, skip the first check operation.

18. The memory control circuit unit according to claim 17, wherein an operation of the memory management circuit generating the check data comprises:

updating first partial data in the first data; and updating the check data according to the updated first partial data.

19. The memory control circuit unit according to claim 18, wherein the first data has mapping information, and an operation of the memory management circuit updating the first partial data in the first data comprises:

updating the first partial data in the first data according to a command from the host system.

20. The memory control circuit unit according to claim 18, wherein the cross-device writing is to only store the updated first partial data in the first data into the memory in the host system, and an amount of data of the first partial data is less than a total amount of data of the first data.

21. The memory control circuit unit according to claim 17, wherein the memory management circuit is further configured to:

in response to the cross-device reading being to completely read back the first data from the memory in the host system, determine that the cross-device reading meets the check trigger condition.

22. The memory control circuit unit according to claim 17, wherein the memory management circuit is further configured to:

in response to the cross-device reading being performed to perform internal data management of the memory storage device, determine that the cross-device reading meets the check trigger condition.

23. The memory control circuit unit according to claim 22, wherein the internal data management comprises:

storing the first data read back from the memory in the host system back into a rewritable non-volatile memory module of the memory storage device.

24. The memory control circuit unit according to claim 22, wherein the internal data management comprises:

creating second data according to the first data read back from the memory in the host system, wherein the second data has mapping information; and performing data migration in a rewritable non-volatile memory module of the memory storage device according to the second data.

* * * * *